(12) United States Patent
Schubert

(10) Patent No.: US 10,177,122 B2
(45) Date of Patent: Jan. 8, 2019

(54) HIGH VOLTAGE SOLID-STATE TRANSDUCERS AND SOLID-STATE TRANSDUCER ARRAYS HAVING ELECTRICAL CROSS-CONNECTIONS AND ASSOCIATED SYSTEMS AND METHODS

(71) Applicant: Micron Technology, Inc., Boise, ID (US)

(72) Inventor: Martin F. Schubert, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/874,064

(22) Filed: Oct. 2, 2015

(65) Prior Publication Data

US 2016/0049387 A1    Feb. 18, 2016

Related U.S. Application Data

(63) Continuation of application No. 13/603,106, filed on Sep. 4, 2012, now Pat. No. 9,171,826.

(51) Int. Cl.
*H01L 25/075* (2006.01)
*H01L 33/62* (2010.01)
(Continued)

(52) U.S. Cl.
CPC .......... *H01L 25/0753* (2013.01); *H01L 33/38* (2013.01); *H01L 33/387* (2013.01);
(Continued)

(58) Field of Classification Search
CPC ....... H01L 33/08; H01L 33/38; H01L 33/387; H01L 33/62
See application file for complete search history.

(56) References Cited

U.S. PATENT DOCUMENTS 6,958,497 B2    10/2005    Emerson et al.
7,508,011 B2    3/2009    Akita et al.
(Continued)

FOREIGN PATENT DOCUMENTS

CN    102354699 A    2/2012
EP    2362420 A1    8/2011
(Continued)

OTHER PUBLICATIONS

Office Action dated Jul. 28, 2016 in Korean Application No. 10-2015-7008648, 10 pages.
(Continued)

*Primary Examiner* — Bilkis Jahan
*Assistant Examiner* — Victor Barzykin
(74) *Attorney, Agent, or Firm* — Perkins Coie LLP

(57) ABSTRACT

Solid-state transducer ("SST") dies and SST arrays having electrical cross-connections are disclosed herein. An array of SST dies in accordance with a particular embodiment can include a first terminal, a second terminal and a plurality of SST dies coupled between the first and second terminals with at least a pair of the SST dies being coupled in parallel. The plurality of SST dies can individually include a plurality of junctions coupled in series with an interconnection between each individual junction. Additionally, the individual SST dies can have a cross-connection contact coupled to the interconnection. In one embodiment, the array can further include a cross-connection between the cross-connection contacts on the pair of the SST dies.

19 Claims, 8 Drawing Sheets

(51) Int. Cl.
*H01L 33/38* (2010.01)
*H01L 33/08* (2010.01)

(52) U.S. Cl.
CPC .............. *H01L 33/62* (2013.01); *H01L 33/08* (2013.01); *H01L 2224/48091* (2013.01); *H01L 2224/48137* (2013.01); *H01L 2933/0066* (2013.01)

(56) References Cited

U.S. PATENT DOCUMENTS

| | | |
|---|---|---|
| 7,535,028 B2 | 5/2009 | Fan et al. |
| 7,712,925 B2 | 5/2010 | Russell |
| 8,598,619 B2 | 12/2013 | Kim et al. |
| 2005/0253151 A1 | 11/2005 | Sakai et al. |
| 2006/0169993 A1 | 8/2006 | Fan et al. |
| 2006/0255349 A1* | 11/2006 | Liu ................. H01L 33/20 257/94 |
| 2008/0179602 A1 | 1/2008 | Negley et al. |
| 2008/0099772 A1 | 5/2008 | Lu et al. |
| 2008/0211416 A1* | 9/2008 | Negley .............. H01L 27/15 315/193 |
| 2008/0303038 A1 | 12/2008 | Grotsch et al. |
| 2009/0032826 A1 | 2/2009 | Hu et al. |
| 2009/0109668 A1 | 4/2009 | Isobe et al. |
| 2009/0134422 A1 | 5/2009 | Sah et al. |
| 2009/0139755 A1 | 6/2009 | Kusano et al. |
| 2009/0166657 A1 | 7/2009 | Yamada et al. |
| 2009/0174337 A1 | 7/2009 | Miskin et al. |
| 2009/0212317 A1 | 8/2009 | Kolodin et al. |
| 2009/0262527 A1 | 10/2009 | Chou |
| 2010/0032692 A1 | 2/2010 | Lee et al. |
| 2010/0052494 A1 | 3/2010 | Feng et al. |
| 2010/0102336 A1 | 4/2010 | Lee et al. |
| 2010/0252840 A1 | 10/2010 | Ibbetson et al. |
| 2011/0180817 A1 | 7/2011 | Ishizaki et al. |
| 2011/0210352 A1 | 9/2011 | Lee et al. |
| 2011/0254022 A1 | 10/2011 | Sasano et al. |
| 2011/0297972 A1 | 12/2011 | Seo et al. |
| 2011/0316009 A1 | 12/2011 | Fukasawa et al. |
| 2011/0316011 A1 | 12/2011 | Ito et al. |
| 2012/0025228 A1 | 2/2012 | Hsieh et al. |
| 2012/0161161 A1 | 6/2012 | Schubert |
| 2013/0306997 A1 | 11/2013 | Lim et al. |

FOREIGN PATENT DOCUMENTS

| | | |
|---|---|---|
| JP | 2004006582 | 1/2004 |
| KR | 100803162 B1 | 2/2008 |
| KR | 20100108906 | 10/2010 |
| KR | 20110098874 A | 9/2011 |
| TW | 200921958 A | 5/2009 |
| WO | 2008062941 A1 | 5/2008 |
| WO | 2008091837 A2 | 7/2008 |
| WO | 2010093190 | 8/2010 |
| WO | 2010126601 | 11/2010 |

OTHER PUBLICATIONS

Extended European Search Report dated Mar. 23, 2016 in European Application No. 13834605.1, 8 pages.
Office Action dated Oct. 28, 2015 in Taiwan Application No. 102131569, 7 pages.
Office Action dated Jun. 29, 2015 in Taiwan Application No. 102131569, 22 pages.
International Search Report and Written Opinion dated Dec. 19, 2013 in International Application No. PCT/US2013/056978, 12 pages.
Office Action dated Aug. 29, 2016 in China Application No. 201380054762.3, 15 pages.
EP Patent Application No. 13834605.1—European Office Action, dated Dec. 8, 2017, 6 pages.
Office Action dated May 5, 2017 in China Application No. 201380054762.3, 4 pages.

* cited by examiner

HIGH VOLTAGE SOLID-STATE TRANSDUCERS AND SOLID-STATE TRANSDUCER ARRAYS HAVING ELECTRICAL CROSS-CONNECTIONS AND ASSOCIATED SYSTEMS AND METHODS

CROSS-REFERENCE TO RELATED APPLICATION

This Application is a continuation of U.S. application Ser. No. 13/603,106 filed Sep. 4, 2012, which is incorporated herein by reference in its entirety.

TECHNICAL FIELD

The present technology is related to solid-state transducers and methods of manufacturing solid-state transducers and solid-state transducer arrays. In particular, the present technology relates to high voltage solid-state transducers having electrical cross-connections and associated systems and methods.

BACKGROUND

Light emitting diodes (LEDs) are solid-state devices that convert electrical energy to light, and generally comprise one or more active regions of semiconductor material formed between oppositely doped materials. When a bias is applied across the doped materials, the active region generates light that can be emitted from all surfaces of the LED. In addition to LEDs, solid-state lighting ("SSL") devices can use organic light emitting diodes ("OLEDs"), and/or polymer light emitting diodes ("PLEDs") as sources of illumination, rather than electrical filaments, plasma, or gas. SSL devices are used in a wide variety of products and applications including common consumer electronic devices such as mobile phones, personal digital assistants ("PDAs"), digital cameras, MP3 players, and other portable electronic devices utilize SSL devices for backlighting. SSL devices are also used for traffic lighting, signage, indoor lighting, outdoor lighting, and other types of general illumination.

In many applications, it is desirable to have SSL devices that provide high light output with better performances being realized through reducing the difference between power supply output voltage and input voltage. One conventional technique of achieving high input voltage in LEDs is serially coupling a plurality of LED dies in an array. In certain embodiments, the individual SSL dies may include more than one LED junction coupled in series.

FIG. 1A is a cross-sectional view and FIG. 1B is a top plan view of a conventional high voltage SSL device 10 shown with two junctions in series. As shown in FIGS. 1A and 1B, the high voltage SSL device 10 includes a substrate 20 carrying a plurality of LED structures 11 (identified individually as first and second LED structures 11a, 11b) that are electrically isolated from one another by an insulating material 12. Each LED structure 11a, 11b has an active region 14, e.g., containing gallium nitride/indium gallium nitride (GaN/InGaN) multiple quantum wells ("MQWs"), positioned between P-type GaN 15 and N-type GaN 16 doped materials. The high voltage SSL device 10 also includes a first contact 17 on the P-type GaN 15 and a second contact 19 on the N-type GaN 16 in a lateral configuration. The individual SSL structures 11a, 11b are separated by a notch 22 through which a portion of the N-type GaN 16 is exposed. An interconnect 24 electrically connects the two adjacent SSL structures 11a, 11b in series through the notch 22.

In operation, electrical power is provided to the SSL device 10 via the contacts 17, 19, causing the active region 14 to emit light. Higher light output can be achieved at the assembly level by mounting several high voltage SSL devices onto a single circuit board, e.g., an LED package array to deliver higher flux. Typical arrays include many LED packages which can be coupled in series, in parallel or in a combination of series and parallel coupled packages. For example, high voltage can be achieved by wiring several conventional high voltage SSL devices 10 in parallel configuration. Arrays of high voltage SSL devices can be advantageous in that the number of LED packages included in the array is independent of the total package voltage (U.S. Patent Publication No. 2012/0161161, incorporated herein by reference in its entirety). However, despite improved light output and higher flux delivery, arrays incorporating the SSL device 10 of FIGS. 1A and 1B are subject to junction failure which can cause problems with chip usability, deterioration, and create high variation in bias across individual coupled SSL devices in the array. For example, an individual LED structure 11a can fail, become an open circuit, or become a short circuit, causing the remaining LED structure 11b as well as other serially or parallel coupled dies to fail, reduce performance or lose stability. Accordingly, there remains a need for high voltage LEDs, high voltage LED arrays and other solid-state devices that facilitate packaging and have improved performance and reliability.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. Moreover, in the drawings, like reference numerals designate corresponding parts throughout the several views.

DETAILED DESCRIPTION

Specific details of several embodiments of solid-state transducers ("SSTs") and associated systems and methods are described below. The term "SST" generally refers to solid-state devices that include a semiconductor material as the active medium to convert electrical energy into electromagnetic radiation in the visible, ultraviolet, infrared, and/or other spectra. For example, SSTs include solid-state light emitters (e.g., LEDs, laser diodes, etc.) and/or other sources of emission other than electrical filaments, plasmas, or gases. SSTs can alternately include solid-state devices that convert electromagnetic radiation into electricity. Additionally, depending upon the context in which it is used, the term "substrate" can refer to a wafer-level substrate or to a singulated device-level substrate. A person skilled in the relevant art will also understand that the technology may have additional embodiments, and that the technology may be practiced without several of the details of the embodiments described below with reference to FIGS. 2A-5.

Figure 1A:
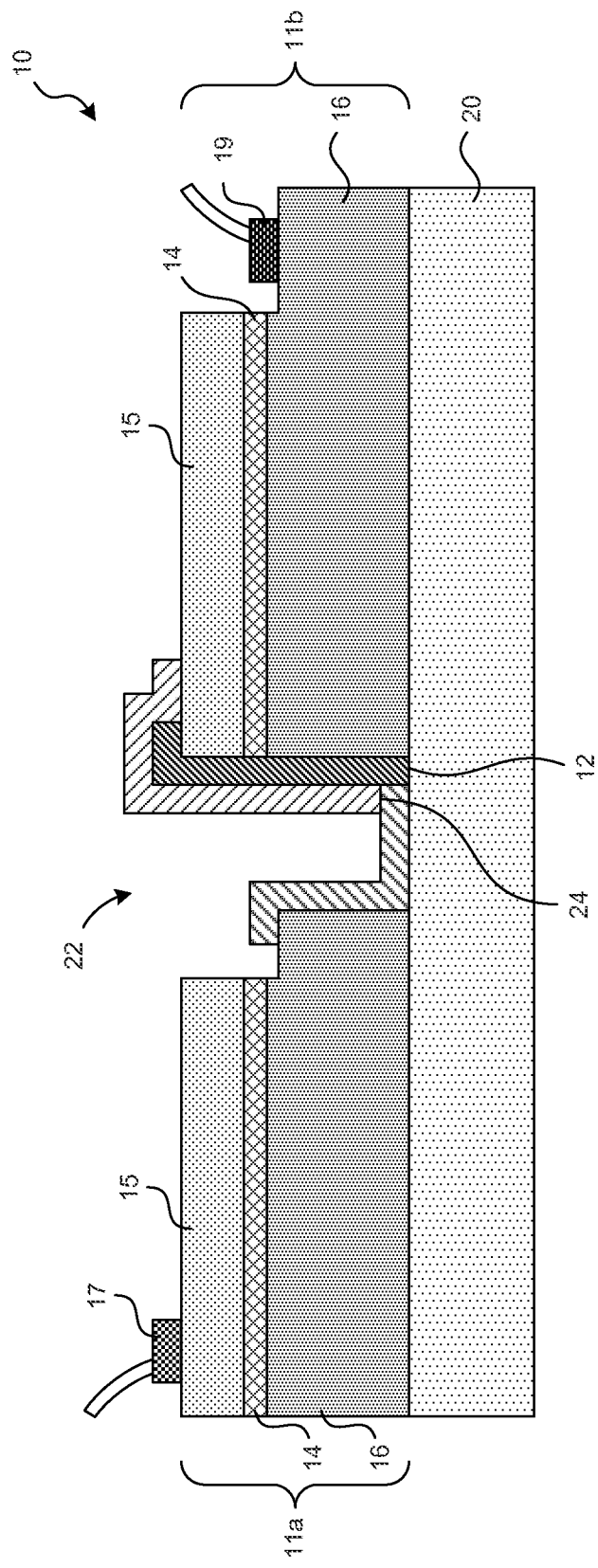
FIGS. 1A and 1B are schematic cross-sectional and top plan diagrams of a high voltage LED device configured in accordance with the prior art.
Figure 1B:
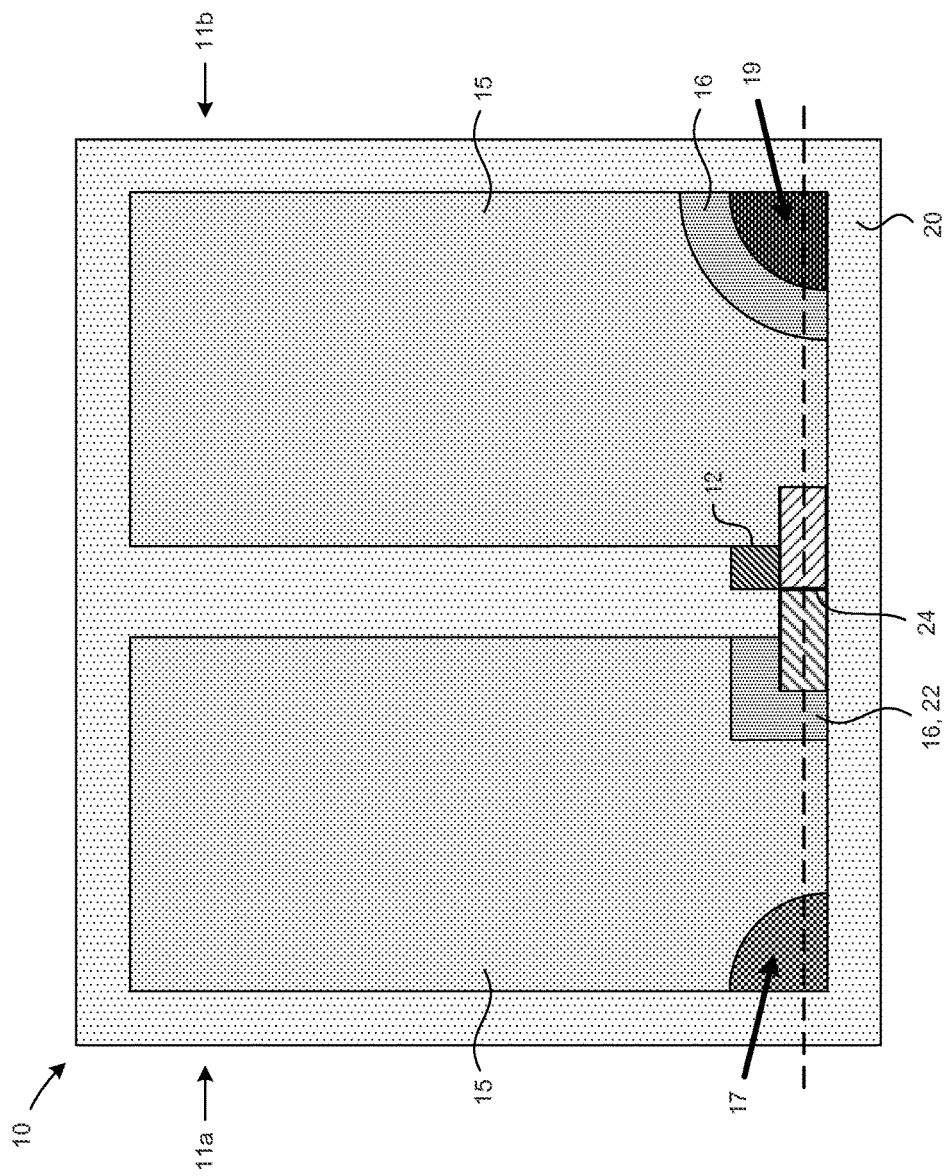
Figure 2A:
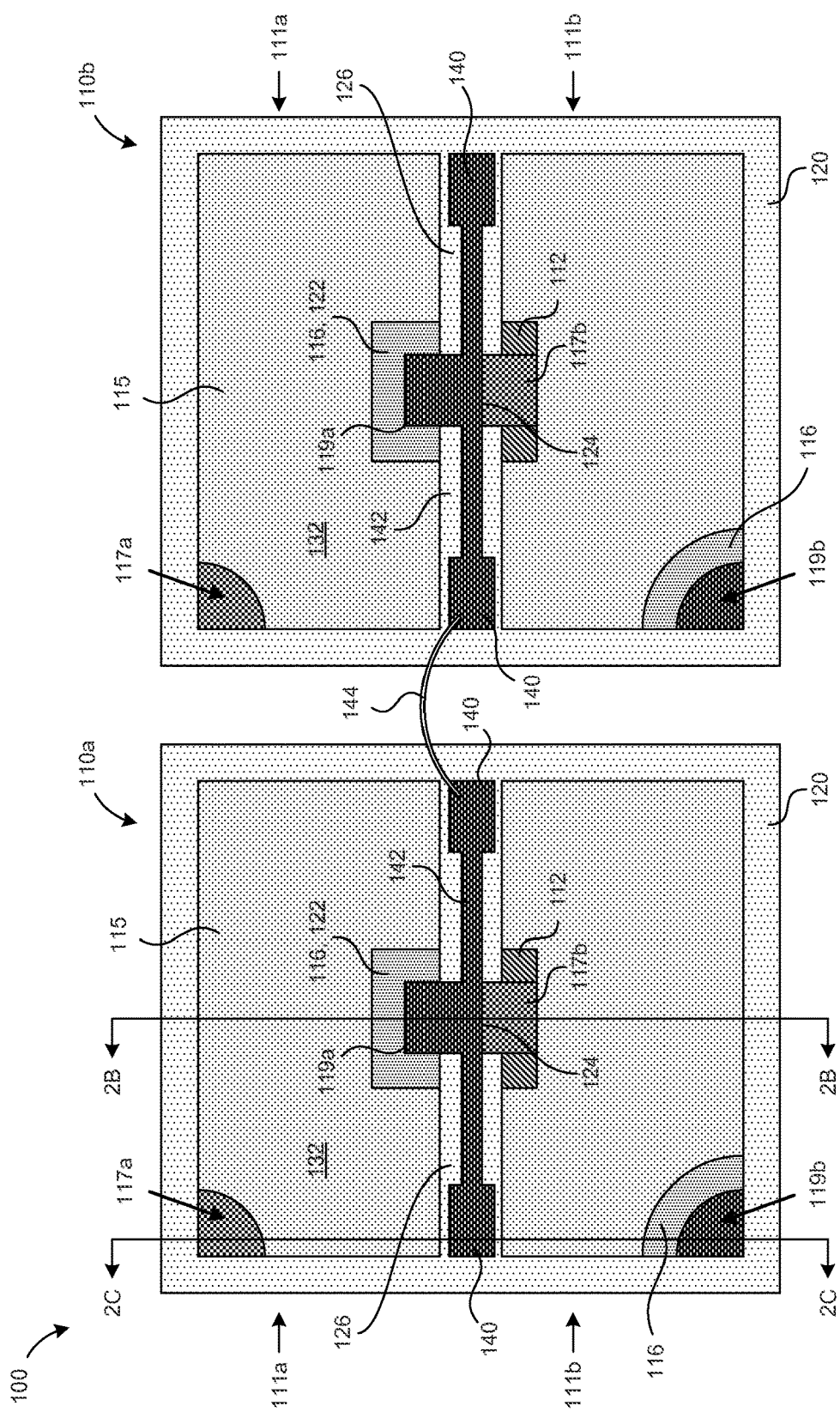
FIG. 2A is a schematic top plan view of a solid-state transducer (SST) array configured in accordance with an embodiment of the present technology.

FIG. 2A is a schematic top plan view of a solid-state transducer (SST) array 100 configured in accordance with an embodiment of the present technology. As shown in FIG. 2A, the SST array 100 includes two SST dies 110 (identified individually as first and second SST dies 110a, 110b) which can be coupled in parallel. Only two SST dies 110 are illustrated in FIG. 2A for simplicity; however, one of ordinary skill in the art will recognize that the SST array 100 can include additional SST dies 110 arranged in a variety of configurations (e.g., in series, in parallel, or a combination of serially and parallel aligned dies 110).

Figure 2B:
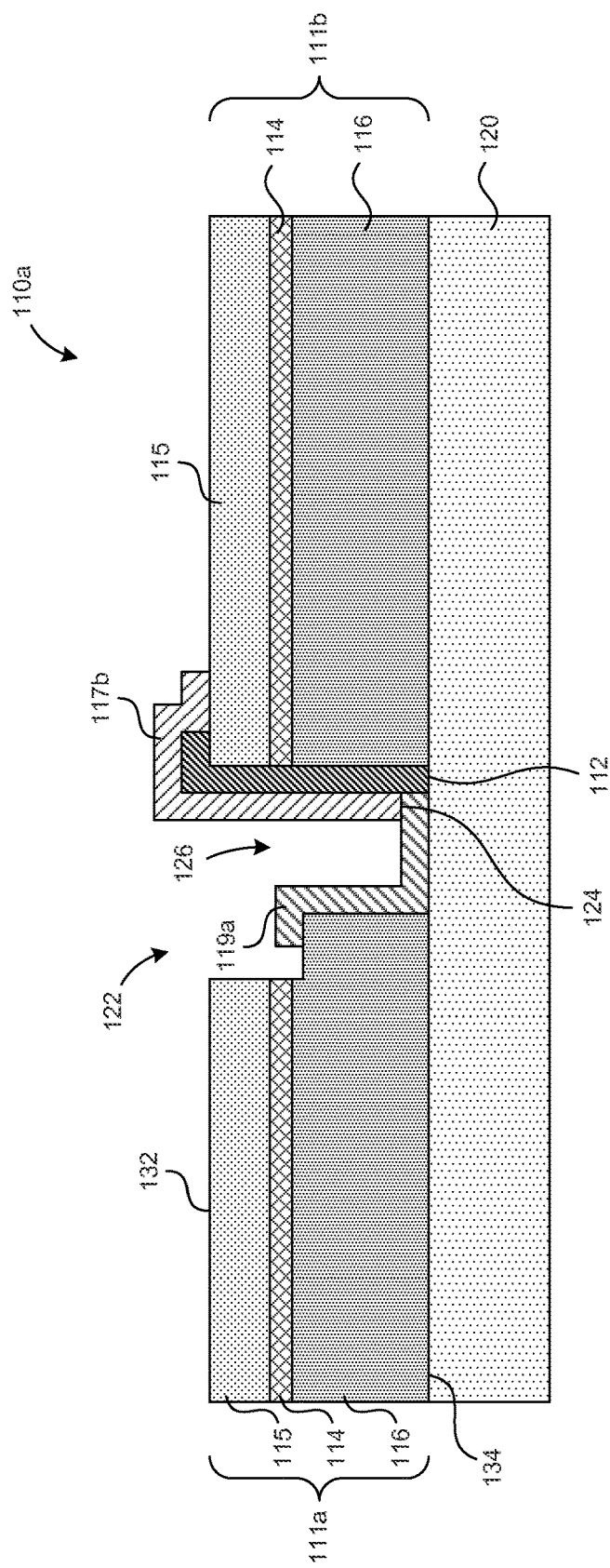
FIGS. 2B-2C are cross-sectional views of a multi junction SST die shown in FIG. 2A and in accordance with an embodiment of the present technology.
Figure 2C:
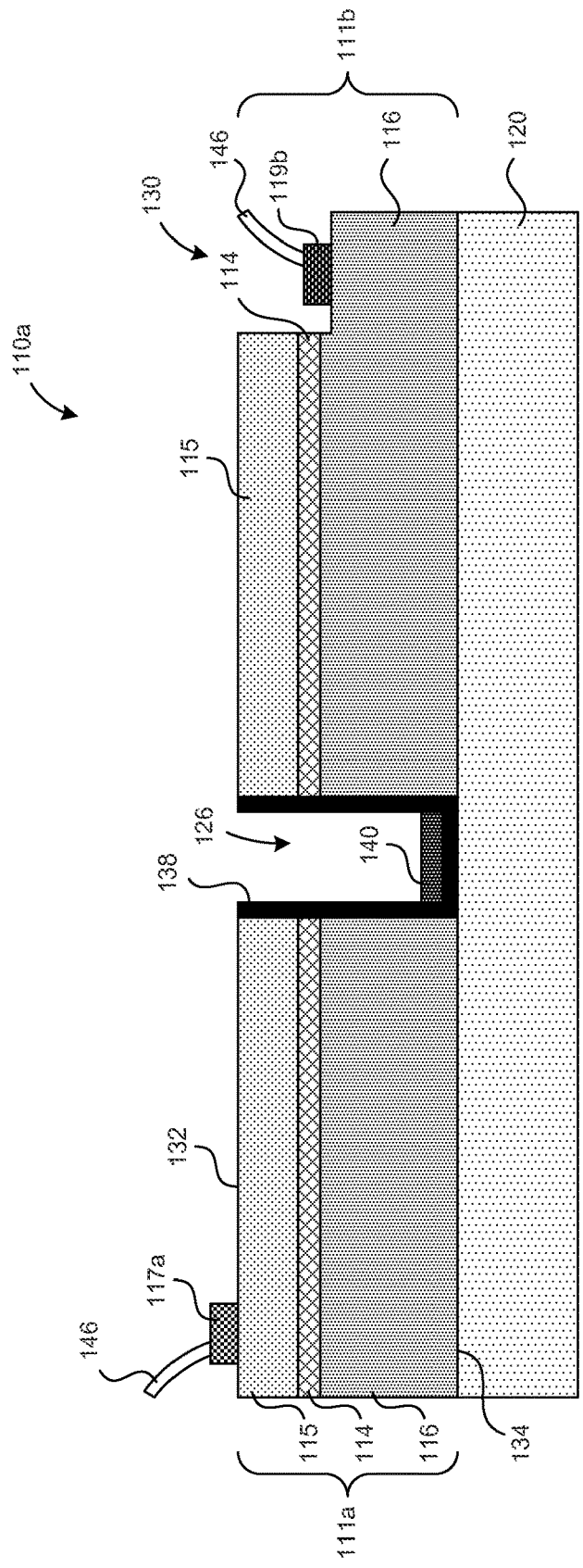

FIGS. 2B and 2C are cross-sectional views of the multi junction SST die 110a of FIG. 2A in accordance with an embodiment of the present technology. Referring to FIGS. 2A-2C together, the SST die 110 can include a substrate 120 carrying a plurality of LED structures 111 (identified individually as first and second LED structures 111a and 111b, respectively) that are electrically isolated from one another by an insulating material 112. For the purposes of illustration, only two LED structures 111a and 111b are shown in each of the individual die 110a, 110b; however, it will be understood that in other embodiments, the SST die 110 can include three, four, five, and/or other suitable numbers of LED structures 111. In further embodiments, the SST die 110 can also include a lens, a mirror, and/or other suitable optical and/or electrical components (not shown).

In one embodiment, the substrate 120 can include a metal, a metal alloy, a doped silicon, and/or other electrically conductive substrate materials. For example, in one embodiment, the substrate 120 can include copper, aluminum, and/or other suitable metals. In other embodiments, the substrate 120 can also include a ceramic material, a silicon, a polysilicon, and/or other generally nonconductive substrate materials.

In certain embodiments, the insulating material 112 can include silicon oxide ($SiO_2$), silicon nitride ($Si_3N_4$), and/or other suitable nonconductive materials formed on the substrate 120 via thermal oxidation, chemical vapor deposition ("CVD"), atomic layer deposition ("ALD"), and/or other suitable techniques. In other embodiments, the insulting material 112 can include a polymer (e.g., polytetrafluoroethylene and/or other fluoropolymer to tetrafluoroethylene), an epoxy, and/or other polymeric materials.

The LED structures 111a, 111b are configured to emit light and/or other types of electromagnetic radiation in response to an applied electrical voltage. In the embodiment illustrated in FIGS. 2B and 2C, the LED structures 111a, 111b each have a first side 132 and a second side 134 opposite the first side 132. The LED structures 111a, 111b individually include a first semiconductor material 115 at the first side 132, a second semiconductor material 116 at the second side 134, and an active region 114 located between the first and second semiconductor materials 115, 116. In other embodiments, the LED structures 111 can also include silicon nitride, aluminum nitride (AlN), and/or other suitable intermediate materials.

The first and second semiconductor materials 115, 116 can be doped semiconductor materials. In certain embodiments, the first semiconductor material 115 can include P-type GaN (e.g., doped with magnesium (Mg)), and the second semiconductor material 116 can include N-type GaN (e.g., doped with silicon (Si)). In other embodiments, the first semiconductor material 115 can include N-type GaN, and the second semiconductor material 116 can include P-type GaN. In further embodiments, the first and second semiconductor materials 115 and 116 can individually include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), aluminum gallium nitride (AlGaN), and/or other suitable semiconductor materials.

The active region 114 can include a single quantum well ("SQW"), multiple quantum wells (MQWs), and/or a single grain semiconductor material (e.g., InGaN), such as a single grain semiconductor material (e.g., InGaN) with a thickness greater than about 10 nanometers and up to about 500 nanometers. In certain embodiments, the active region 114 can include an InGaN SQW, GaN/InGaN MQWs, and/or an InGaN bulk material. In other embodiments, the active region 114 can include aluminum gallium indium phosphide (AlGaInP), aluminum gallium indium nitride (AlGaInN), and/or other suitable materials or arrangements.

In certain embodiments, at least one of the first semiconductor material 115, the active region 114, and the second semiconductor material 116 can be formed on the substrate material 120 via metal organic chemical vapor deposition ("MOCVD"), molecular beam epitaxy ("MBE"), liquid phase epitaxy ("LPE"), and hydride vapor phase epitaxy ("HVPE"). In other embodiments, at least one of the foregoing components and/or other suitable components (not shown) of the LED structure 111 may be formed using other suitable epitaxial growth techniques.

The individual LED structures 111a, 111b also each include a first electrode or contact 117 (identified individually as 117a and 117b) and a second electrode or contact 119 (identified individually as 119a and 119b). The first contacts 117a, 117b are electrically coupled to the first semiconductor material 115 of the first and second LED structures 111a, 111b, respectively. The second contacts 119a, 119b are electrically coupled to the second semiconductor material 116 of the first and second LED structures 111a, 111b, respectively. As shown in FIG. 2C, the first LED structure 111a includes a first contact 117a located on the first semiconductor material 115 and the second LED structure 111b includes a second contact 119b located on the second semiconductor material 116 through a gap 130 in the active region 114 and the first semiconductor material 115. First contact 117a and second contact 119b provide external electrical contact points for coupling the SST die 110 with external contacts and/or devices for receiving or applying electrical power.

FIGS. 2A and 2C show the first contact 117a accessible at the first side 132 of the LED structure 111a. As illustrated, the first contact 117a can be formed over a smaller portion of the first semiconductor material 115. In other embodiments, not shown, the first contact 117a can extend over a larger portion of the underlying first semiconductor material 115. The first contact 117a can be formed using chemical vapor deposition ("CVD"), physical vapor deposition ('PVD'), atomic layer deposition ("ALD"), spin coating, patterning, and/or other suitable techniques known in the art. In some embodiments, the first contact 117a can be formed of non-reflective materials. In other embodiments, reflective contact materials, including nickel (Ni), silver (Ag), copper (Cu), aluminum (Al), tungsten (W), and/or other reflective materials can be used to form the first contact 117a.

Likewise, the second contact 119b is accessible through the gap 130 at the first side 132 of the LED structure 111b. Suitable second contact materials can include titanium (Ti), aluminum (Al), nickel (Ni), silver (Ag), and/or other suitable conductive materials. The second contact 119b can also be formed using CVD, PVD, ALD or other suitable techniques known in the semiconductor fabrication arts. As described, the gap 130 can be formed, for example, by etching a portion of the LED structure 111b extending from the first side 132 of the SST die 110 to or into the second semiconductor material 116. In the embodiment illustrated in FIGS. 2A and 2C, the second contact 119b can be positioned near or at the edge of the LED structure 111b such that no dielectric material is necessary for electrical insulation of the second contact 119b from the first semiconductor material 115 or active region 114. However, in other embodiments, second contacts 119 can be buried contact elements within the LED structure 111, such as those described in the vertically arranged solid-state transducers described in U.S. patent application Ser. No. 13/346,495, which is incorporated herein by reference in its entirety. In such embodiments, a dielectric coating of etched walls in the LED structure 111 can electrically isolate the second contacts 119 from the first semiconductor material 115 and the active region 114.

As shown in FIGS. 2A-2C, the LED structures 111a, 111b are arranged in a lateral array with a channel 126 (FIGS. 2A and 2C) separating the adjacent LED structures 111a, 111b. The individual LED structures 111a, 111b also include a notch 122 through which a portion of the second semiconductor material 116 is exposed. An interconnect 124 electrically connects the two adjacent LED structures 111a, 111b through the corresponding notch 122. As such, the first and second LED structures 111a, 111b are serially coupled to one another. In one embodiment, the interconnect 124 can be an interconnection point between the second contact 119a on the first LED structure 111a and the first contact 117b on the second LED structure 111b. The contacts 117b, 119a can be deposited or otherwise formed in the notch 122 by similar techniques as those described for first and second contacts 117a, 119b (e.g., CVD, PVD, ALD or other suitable techniques).

The channel 126 divides the SST device 110 such that the LED structures 111a, 111b of the SST die 110 are isolated from each other. For example, the channel 126 can be formed before the contacts 117b, 119a and the interconnect 124 are formed in the notch 122 and can extend to the second side 134 of the LED structures 111a, 111b (as shown in FIGS. 2B and 2C). In one embodiment, all or portions of the sidewalls of the channel 126 and/or the notch 122 can be coated with a dielectric material 138 (FIG. 2C). In some arrangements, the dielectric material 138 can electrically insulate the second contact 119 (not shown) along a path extending through the first semiconductor material 115, and the active region 114. The dielectric material 138 can include silicon dioxide ($SiO_2$), silicon nitride (SiN), and/or other suitable dielectric materials, and can be deposited using CVD, PVD, ALD, patterning, and/or other suitable techniques known in the art.

The SST die 110 can also include a third contact 140 coupled to the interconnect 124 and in accordance with an embodiment of the present technology. As illustrated in FIG. 2A, the SST die 110 can have one or more third contacts 140 positioned in the channel 126 and electrically coupled to the interconnect 124 via one or more conductive lines 142. In one embodiment, the third contact 140 is externally accessible through the channel 126 between the first and second LED structures 111a, 111b. In other embodiments, the third contact 140 can be positioned at the first side 132 of the LED structure 111a or 111b with suitable insulating or dielectric materials intervening between the third contact 140 and the underlying first semiconductor material 115. Suitable third contact materials 140 can include titanium (Ti), aluminum (Al), nickel (Ni), silver (Ag), and/or other suitable conductive materials. The third contact 140 can also be formed using CVD, PVD, ALD or other suitable techniques known in the semiconductor fabrication arts.

In the illustrated embodiment, the dielectric material 138 is positioned to insulate the exposed third contacts 140 laterally apart from the first semiconductor material 115, the second semiconductor material 116 and the active region 114, and therefore reduces the likelihood of shorting the contacts to each other during subsequent processing or in operation. In other embodiments, the SST dies 110 can include larger or smaller coatings or portions of the dielectric material 138.

As shown in FIG. 2C, the dielectric material 138 can coat the inner walls of the channel 126 but does not cover the third contacts 140. In a particular embodiment, the conductive lines 142 can be formed over the dielectric material 138 between the interconnect 124 and the third contacts 140. The conductive lines 142 can be made from a suitable electrically conductive material, such as nickel (Ni), silver (Ag), copper (Cu), aluminum (Al), tungsten (W) and/or other suitable conductive materials. The dielectric material 138 underlying the conductive lines 142 electrically isolates the third contact 140 from the first contact 117a. The conductive lines 142 can be formed using deposition, patterning, and/or other suitable methods known in the art, and can be made from electrically conductive materials similar to those used for the second contact material 119 and or the third contact material 140.

The SST dies 110a, 110b can undergo further processing to add elements for attachment to additional substrates and/or devices. For example, bond pads (not shown) can be electrically coupled to the first, second and third contacts 117a, 119b and 140, respectively. The bond pads can be metal or metal alloy structures (e.g., Ni, Ag, Cu, Sn Al, W, etc.). In some arrangements, wire bonds 146 (FIG. 2C) can be used to electrically couple external devices, additional dies, and/or other power sources to the first and second contacts 117a, 119b of the SST dies 110. In other embodiments, the resulting SST dies 110 can include first and second contacts 117a and 119b that can be mounted on a board, a package or another component without requiring wire bonds, e.g., using a solder reflow process.

In one embodiment, the third contact 140 can provide a provision for forming a cross-connection 144 (FIG. 2A) between an adjacent SST die 110b coupled in the SST array 100. The cross-connection 144 can provide an electrical connection to at least one intermediate point located between the multiple LED structures 111a, 111b of the SST dies 110a, 110b within the SST array 100. In operation, the cross-connection 144 can provide a reduced variation in bias across individual SST dies 110 (e.g., dies 110a, 110b). Referring to FIG. 2A, with the cross-connection between the third contact 140 on SST die 110a and the corresponding third contact 140 on SST die 110b, the first LED structures 111a and the second LED structures 111b can have identical voltage applied. Additionally, the cross-connection 144 can provide protection against SST die 110 or SST array 100 failures. For example, if one LED structure fails and becomes either an open circuit or a short circuit, additional LED structures remain operational with the cross-connection 144.

In a particular example, if LED structure 111a of SST die 110a becomes short circuited (e.g., having low resistance), voltage applied to both SST dies 110 in parallel will preferentially flow through LED structure 111a of SST die 110a, and SST die 110b will not operate or operate with diminished capacity. The forward voltage will flow to LED structure 111b of SST die 110a; however, the cross-connection 144 provides forward voltage evenly to both LED structure 111b of SST die 110a as well as LED structure 111b of SST die 110b. As such more die remain in operation despite the faulty LED structure 111a. Accordingly, the third contact 140 electrically coupled to the interconnects 124 between LED structures 111a and 111b provide the accessible electrical connection within high voltage (e.g., multiple junction) SST dies 110. In additional embodiments, the SST die 110 can include more than two LED structures 111 and, accordingly, can include multiple interconnects 124 with corresponding third contacts 140 provided for additional cross-connections 144 between, for example, parallel-coupled SST dies 110.

Figure 3:
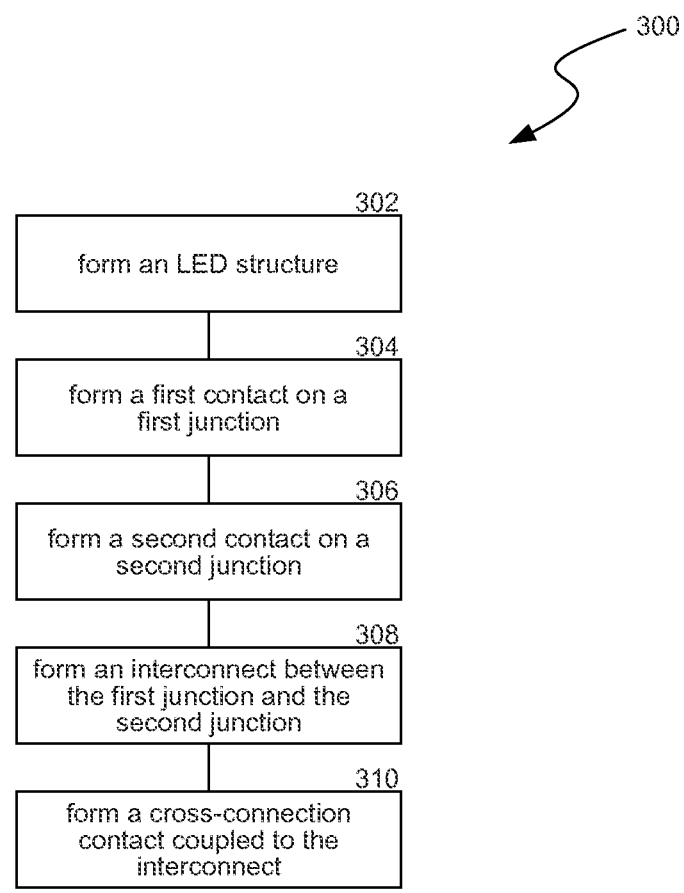
FIG. 3 is a flowchart of a method of forming an SST die having a plurality of junctions coupled in series in accordance with embodiments of the present technology.

FIG. 3 is a flowchart of a method 300 of forming an SST die having a plurality of junctions coupled in series in accordance with embodiments of the present technology. As shown in FIG. 3, an initial stage (block 302) of the method 300 can include forming a light-emitting diode (LED) structure having a first semiconductor material at a first side, a second semiconductor material at a second side opposite the first side, and a light-emitting active region between the first semiconductor material and the second semiconductor material. Another stage (block 304) of the method 300 includes forming a first contact on a first junction, wherein the first contact is electrically coupled to the first semiconductor material. In a further stage (block 306), the method 300 includes forming a second contact on a second junction, wherein the second contact is electrically coupled to the second semiconductor material.

The method 300 can include yet another stage (block 308) of forming an interconnect between the first junction and the second junction, wherein the interconnect is electrically coupled to the first semiconductor material and the second semiconductor material. In some arrangements, the first, second and cross-connection contacts are accessible from the first side of the LED structure. In yet a further stage (block 310), the method 300 includes forming a cross-connection contact electrically coupled to the interconnect. The cross-connection contacts can be used to electrically couple the SST die to another die in an array at an intermediate point located between the first and second junctions.

Figure 4:
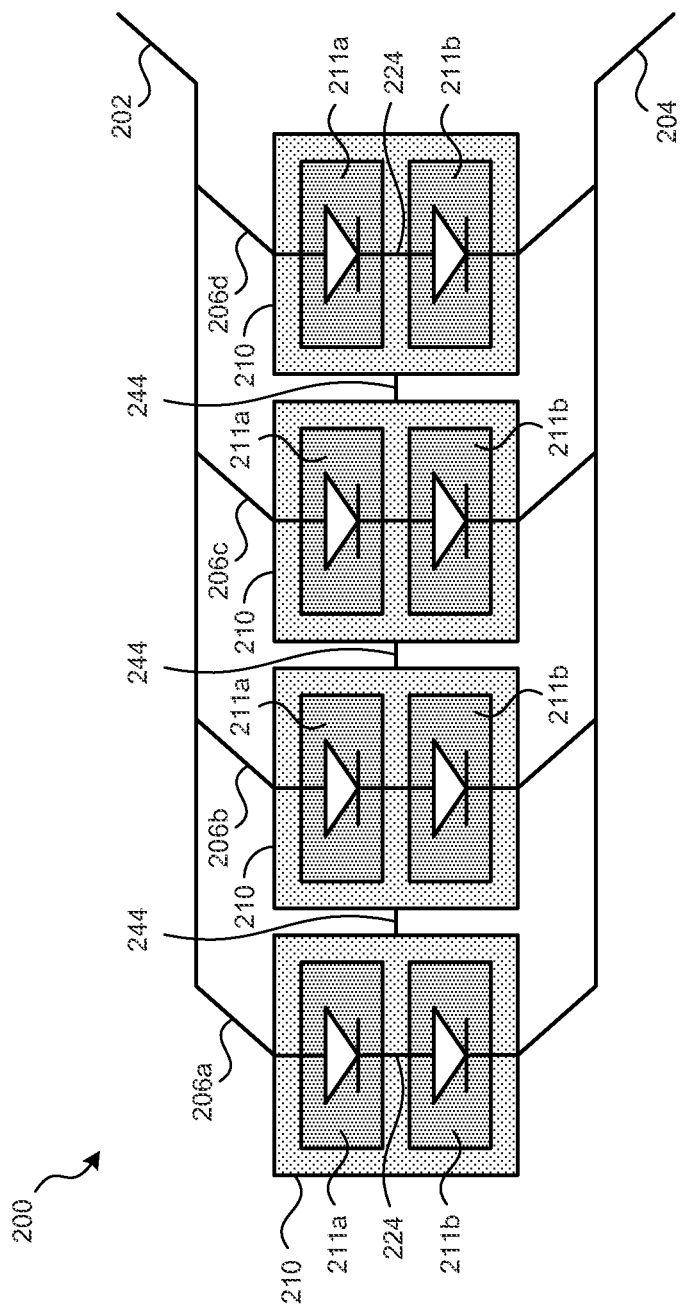
FIG. 4 is a schematic block diagram of an array assembly of SST dies having electrical cross-connections in accordance with embodiments of the present technology.

FIG. 4 is a schematic block diagram of an array assembly 200 of SST dies 210 having electrical cross-connections in accordance with embodiments of the present technology. As shown in FIG. 4, the array assembly 200 includes a first terminal 202, a second terminal 204, and a plurality of SST dies 210 coupled in parallel between the first and second terminals 202 and 204. The first and second terminals 202 and 204 are configured to receive an input voltage from an external power supply (not shown).

In the illustrated embodiment, the SST dies 210 are arranged as separate strings individually identified as 206a-d coupled in parallel with each other. The strings 206a-d are each shown to have a single SST die 210 each having multiple LED junctions 211 (e.g., LED structures individually identified as 111a and 111b); however, in other embodiments, the SST dies 210 may be arranged into a single string and/or have other suitable arrangements. In further embodiments, at least one of the strings 206a-d may carry more than one SST dies 210 in series.

In certain embodiments, the individual SST dies 210 have two LED junctions 211a, 211b electrically coupled in series by an interconnect 224. In other embodiments, the individual dies 210 may include more than two LED junctions 211 (e.g., three, four, five, etc.) electrically coupled in series by interconnects. The array assembly 200 also includes a plurality of cross-connections 244 electrically coupling interconnects 224 of SST dies 110 between the strings 206a-d. As such, input voltage provided through terminals 202, 204 may flow through the strings 106a-d and between the strings to provide alternative electrical paths for improving light output and higher flux delivery. Accordingly, array assemblies, such as assembly 200, which incorporate the SST dies 210 or dies 110 (illustrated in FIGS. 2A-2C), have provisions to overcome junction failure, providing reduced variation in bias across individual coupled SST dies in the array. Moreover, the array assemblies 200 can remain in use even after a junction failure, providing improved chip performance and reliability, thereby reducing manufacturing costs.

Figure 5:
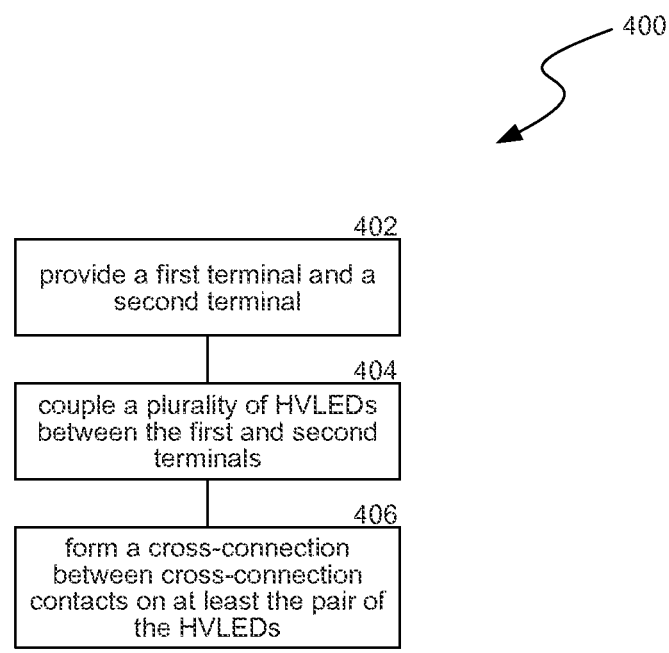
FIG. 5 is a flowchart of a method of forming an array of high voltage light-emitting diodes (HVLEDs) in accordance with embodiments of the present technology.

FIG. 5 is a flowchart of a method 400 of forming an array of high voltage light-emitting diodes (HVLEDs) in accordance with embodiments of the present technology. As shown in FIG. 5, an initial stage (block 402) of the method 400 can include providing a first terminal and a second terminal, e.g., for receiving an input voltage from an external power supply. Another stage (block 404) of the method 400 includes coupling a plurality of HVLEDs between the first and second terminals. In some embodiments, at least a pair of HVLEDs can be coupled in parallel. The plurality of HVLEDs can individually include a plurality of junctions coupled in series with an interconnection between each individual junction. In some arrangements, the individual HVLED have a cross-connection contact coupled to the interconnection.

A further stage (block 406) of the method 400 can include forming a cross-connection between the cross-connection contacts on at least the pair of the HVLEDs. In some arrangements, a bond pad can be coupled to the cross-connection contacts and forming a cross-connection between the contacts can include wire bonding between the bond pads. Additional stages (not shown) may include electrically coupling the first terminal and the second terminal to an AC power source or other power source.

From the foregoing, it will be appreciated that specific embodiments of the technology have been described herein for purposes of illustration, but that various modifications may be made without deviating from the disclosure. The SST dies 110, 210 and the array assemblies 100, 200 can include additional components, and/or different combinations of the components described herein. For example, the SST dies 110 can include more than two junctions and/or be provided with more than one interconnect 124. In such arrangements, additional third contacts 140 can be formed providing for additional intermediate electrical access points between the multiple junctions or LED structures. Furthermore, the array 100 includes a 1×1 array of SST dies 110, and the array assembly 200 includes a 1×4 array of SST dies 210. In other embodiments, assemblies and arrays can include different numbers of SST dies and/or have different shapes (e.g., rectangular, circular, etc.). Additionally, certain aspects of the present technology described in the context of particular embodiments may be eliminated in other embodiments. For example, the configuration of the dielectric material 138 can be altered to expose or cover differing combinations of semiconductor materials, contacts or conductive lines. Additionally, while advantages associated with certain embodiments of the present technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

I claim:

1. A method of forming an array of light-emitting diodes (LEDs), comprising:
   providing a first terminal and a second terminal;
   coupling a plurality of LED dies between the first and second terminals with at least a pair of the LED dies being coupled in parallel, wherein:
      each of the plurality of LED dies includes a plurality of junctions coupled in series with an interconnection between an adjacent pair of the plurality of junctions and a cross-connection contact coupled to the interconnection; and
      forming a cross-connection between the cross-connection contacts on at least the pair of the LED dies.

2. The method of claim 1, further comprising electrically coupling the first terminal and the second terminal to an AC power source.

3. The method of claim 1, further comprising coupling a bond pad to the cross-connection contact on each of the pair of LED dies, wherein forming the cross-connection between the cross-connection contacts on at least the pair of the LED dies includes wire bonding between the bond pads on at least the pair of the LED dies.

4. The method of claim 1 wherein the cross-connection contact of each of the plurality of LED dies is coupled to the interconnection via a conductive line.

5. The method of claim 1 wherein the plurality of junctions coupled in series are separated by a trench.

6. The method of claim 5 wherein the interconnection extends across the trench.

7. A method of forming a solid-state transducer (SST) die having a plurality of junctions coupled in series, the method comprising:
   forming, on a semiconductor wafer, a light-emitting diode (LED) structure having a first semiconductor material at a first side, a second semiconductor material at a second side opposite the first side, and a light-emitting active region between the first semiconductor material and the second semiconductor material;
   forming, on the semiconductor wafer, a first contact on a first junction, the first contact electrically coupled to the first semiconductor material;
   forming, on the semiconductor wafer, a second contact on a second junction, the second contact electrically coupled to the second semiconductor material;
   forming, on the semiconductor wafer, a trench between the first junction and the second junction;
   forming, on the semiconductor wafer, an interconnect between the first junction and the second junction, the interconnect extending across the trench and electrically coupling the first junction and the second junction;
   forming, on the semiconductor wafer, a conductive line electrically connected to the interconnect; and
   forming, on the semiconductor wafer, a cross-connection contact electrically coupled to the conductive line,
   wherein the cross-connection contact is separated from the first and second semiconductor materials by an insulating material such that the cross-connection contact is not in direct electrical contact with either of the first and second semiconductor materials.

8. The method of claim 7 wherein the first, second and cross-connection contacts are accessible from the first side of the LED structure.

9. The method of claim 7 wherein forming the conductive line comprises forming the conductive line extending along the trench transversely with respect to the interconnect.

10. The method of claim 7 wherein forming the interconnect comprises forming the interconnect between the first contact and the second contact.

11. The method of claim 7 wherein the first contact is electrically isolated from the second semiconductor material of the first junction and the second contact is electrically isolated from the first semiconductor material of the second junction.

12. An array comprising:
   first and second solid-state transducer (SST) dies, each die comprising:
      first and second light-emitting diode (LED) junctions each having a first semiconductor material and a second semiconductor material;
      a trench separating the first LED junction from the second LED junction;
      an interconnect extending across the trench and between the first semiconductor material of the first LED junction and the second semiconductor material of the second LED junction, the interconnect electrically coupling the first LED junction to the second LED junction in series; and
      a conductive line electrically connected to the interconnect and extending along the trench transversely with respect to the interconnect; and
   a cross-connection extending between the conductive line of the first SST die and the conductive line of the second SST die, the cross-connection electrically coupling the first SST die to the second SST die in parallel.

13. The array of claim 12 wherein the first and second LED junctions are lateral LED junctions.

14. The array of claim 12, further comprising a first terminal and a second terminal, wherein a plurality of SST dies are coupled between the first terminal and the second terminal in series, and wherein the first SST die and the second SST die are coupled between the first terminal and the second terminal in parallel.

15. The array of claim 12, further comprising a first contact electrically coupled to the first semiconductor material of the first LED junction and a second contact electrically coupled to the second semiconductor material of the second LED junction, wherein the interconnect extends between the first contact and the second contact.

16. The array of claim 15 wherein the first contact is electrically isolated from the second semiconductor material of the first LED junction, and wherein the second contact is electrically isolated from the first semiconductor material of the second LED junction.

17. The array of claim 12, further comprising a cross-connection contact coupled to the conductive line.

18. The array of claim 17 wherein the cross-connection extends between the cross-connection contact of the first SST die and the cross-connection contact of the second SST die.

19. The array of claim 17 wherein the cross-connection contact is separated from the first semiconductor material and the second semiconductor material by an insulating material such that the cross-connection contact is not in direct electrical contact with either of the first and second semiconductor materials.

* * * * *